US010114088B2

(12) United States Patent
Eichhorn et al.

(10) Patent No.: US 10,114,088 B2
(45) Date of Patent: Oct. 30, 2018

(54) METHOD FOR THE GENERATION OF RADICALS FOR DYNAMIC NUCLEAR POLARIZATION AND USES THEREOF FOR NMR, MRS AND MRI

(71) Applicant: ECOLE POLYTECHNIQUE FEDERALE DE LAUSANNE (EPFL), Lausanne (CH)

(72) Inventors: Tim Rolf Eichhorn, Basel (CH); Christophe Roussel, Pontarlier (FR); Arnaud Comment, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 490 days.

(21) Appl. No.: 14/775,191

(22) PCT Filed: Mar. 14, 2013

(86) PCT No.: PCT/EP2013/055234
§ 371 (c)(1),
(2) Date: Sep. 11, 2015

(87) PCT Pub. No.: WO2014/139573
PCT Pub. Date: Sep. 18, 2014

(65) Prior Publication Data
US 2016/0033590 A1    Feb. 4, 2016

(51) Int. Cl.
*G01V 3/00* (2006.01)
*G01R 33/30* (2006.01)
(Continued)

(52) U.S. Cl.
CPC ............ *G01R 33/30* (2013.01); *G01R 33/282* (2013.01); *G01R 33/446* (2013.01);
(Continued)

(58) Field of Classification Search
CPC .... G01R 33/30; G01R 33/282; G01R 33/446; G01R 33/465; G01R 33/56; G01R 33/62; G01R 33/5601
(Continued)

(56) References Cited

U.S. PATENT DOCUMENTS 7,205,764 B1    4/2007  Anderson et al.
7,649,355 B2 *  1/2010  Strange .................. G01R 33/28
                                                        324/307

(Continued)

FOREIGN PATENT DOCUMENTS

WO    2006/011810 A2    2/2006

OTHER PUBLICATIONS

Tim R. Eichhorn et al., "Hyperpolarization without persistent radicals for in vivo real-time metabolic imaging", PNAS, Nov. 5, 2013, pp. 18064-08069, vol. 110, No. 45, XP-002716606.
(Continued)

*Primary Examiner* — Susan Lee
(74) *Attorney, Agent, or Firm* — Sughrue Mion, PLLC

(57) ABSTRACT

A method for the preparation of a sample comprising highly polarized nuclear spins is proposed, comprising at least the following steps:
a) provision of molecules with 1,2-dione structural units and/or molecules with 2,5-diene-1,4-dione structural units in the solid state;
b) generation of radicals from these molecules by photo induced electron transfer by a first electromagnetic irradiation in the visible or ultraviolet frequency range in the solid state;
c) dynamic nuclear polarization in the presence of a magnetic field in the solid state by applying a second electromagnetic irradiation with a frequency adapted to transfer spin polarization from the electrons to the nuclear
(Continued)

spins leading to a highly polarized state thereof. Furthermore uses of correspondingly prepared samples for NMR, MRS and MRI experiments are proposed.

29 Claims, 5 Drawing Sheets

(51) Int. Cl.
    *G01R 33/28*    (2006.01)
    *G01R 33/465*   (2006.01)
    *G01R 33/62*    (2006.01)
    *G01R 33/44*    (2006.01)
    *G01R 33/56*    (2006.01)

(52) U.S. Cl.
    CPC ........... *G01R 33/465* (2013.01); *G01R 33/56* (2013.01); *G01R 33/62* (2013.01); *G01R 33/5601* (2013.01)

(58) Field of Classification Search
    USPC ......................................................... 324/318
    See application file for complete search history.

(56) References Cited

U.S. PATENT DOCUMENTS

2006/0199272 A1   9/2006   Wistrand
2008/0260649 A1   10/2008  Thaning et al.

OTHER PUBLICATIONS

International Search Report for PCT/EP2013/055234 dated Dec. 3, 2013.

* cited by examiner

METHOD FOR THE GENERATION OF RADICALS FOR DYNAMIC NUCLEAR POLARIZATION AND USES THEREOF FOR NMR, MRS AND MRI

CROSS REFERENCE TO RELATED APPLICATIONS

This application is a National Stage of International Application No. PCT/EP2013/055234 filed Mar. 14, 2013, the contents of which are incorporated herein by reference in their entirety.

TECHNICAL FIELD

The present invention relates to a method for the generation of radicals for dynamic nuclear polarization (DNP) and uses thereof in particular for nuclear magnetic resonance (NMR), magnetic resonance spectroscopy (MRS) and magnetic resonance imaging (MRI) applications. Specifically, a method to generate radicals in frozen material via photoinduced electron transfer for DNP and hyperpolarization is proposed.

PRIOR ART

Magnetic resonance (MR) is a very powerful imaging modality in terms of temporal and spatial resolution of anatomical details. The modality is widespread and contrast agents are used extensively for improved contrast or perfusion examination. MR is also a unique technique to obtain in vivo metabolic maps using the spectroscopic information that can be extracted from the time-domain acquisitions. In particular, it is possible to monitor the biochemical transformations of specific substrates that are delivered to subjects. Because it gives access to the kinetics of the conversion of substrates into metabolites, MRS of the carbon nuclei (13C) is one of the most powerful techniques to investigate intermediary metabolism. The investigation of cerebral and cardiac metabolism using 13C MRS brought essential information on the use of energy substrate of the brain and of the heart.

Following the introduction of a hyperpolarization technique based on dynamic nuclear polarization (DNP) a decade ago, it became possible to detect intermediate metabolites with an unprecedented time resolution. DNP takes advantage of the fact that unpaired electron spins in a frozen solution placed in a magnetic field of a few Tesla at a temperature of 1K, are essentially all antiparallel with respect to the applied field. This high electron spin polarization can be transferred to the surrounding nuclear spins by exposing the sample to microwaves with an energy roughly equivalent to the magnetic resonance energy of the electron spins minus or plus the magnetic resonance energy of the nuclear spins. Following this process which typically takes a few hours, the frozen sample is transformed into a solution using hot water and, if the transition from 1K to room temperature is rapid enough (less than 1 s), the nuclear spins retain essentially the polarization reached at 1K. This means that the nuclear polarization can be on the order of unity as compared to ~10 at thermal equilibrium in a standard MRI scanner. This enhancement of several orders of magnitude can then be exploited to measure the in vivo metabolic transformation of biomolecules with a high-temporal resolution. To be able to perform DNP, it is however necessary to introduce unpaired electron spins into the samples, which are usually incorporated in the solution in the form of stable free radicals. These molecules are thus present at a non-negligible concentration (~1 mM) in the solutions obtained following dissolution and a filtration process is mandatory before injection in subjects.

As a matter of fact, dynamic nuclear polarization (DNP) is the most versatile method for enhancing the polarization of nuclear spins. It found applications in particle Physics to polarize targets, in solid-state NMR, and more recently in liquid-state NMR, MRS, and MRI in the fields of chemistry, biology, and medicine with the introduction of dissolution DNP. As pointed out above, to perform DNP, it is necessary to introduce paramagnetic centers inside the sample containing the nuclear spins to be polarized. Up to now, the most attractive paramagnetic centers have been the trityl stable radicals for dissolution DNP and nitroxyl radicals for solid-state DNP, although other specific stable radicals have been proposed.

For liquid-state NMR, MRS and MRI, there are two main issues linked to the presence of stable radicals in the samples:

(a) for in vivo applications in animals or humans, radical species have to be filtered out for toxicity issues; due to this procedure, the time delay between preparation and injection of the hyperpolarized molecules is increased and leads to losses in polarization as a consequence of nuclear spin relaxation. It also introduces the risk of contamination and thus requires pharmacological tests that further increase the delay.

(b) the radicals have an adverse effect on the lifetime of the DNP-enhanced nuclear polarization through nuclear spin relaxation, both in the solid state and in the liquid state. It is thus necessary to rapidly warm up and dilute the sample to transform the frozen samples containing about 5-100 mM of stable radicals into a liquid with a largely reduced radical concentration, typically less than 1 mM.

Two potential solutions have been proposed so far:

(a) to use, instead of radicals, photo-excited electronic triplet states as paramagnetic centers for DNP experiments, since such states have a finite lifetime (see e.g. U.S. Pat. No. 7,205,764, mentioning benzophenone, pentacene and anthracene as well as tetraphenylporphyrin and etioporphyrin as possible molecules for the excitation).

(b) to create radicals that are only reasonably persistent at low temperatures either by high-energy radiation or from photolabile radical precursors by performing photolysis with light within a wavelength ranging from 200 to 300 nm (see e.g. US 2006/0199272, mentioning peroxides, iodine compounds, nitrites, nitriles or azo compounds as possible starter molecules for the photo-decomposition).

In method (a), the sample has to be photo-excited shortly (less than a second) before the microwaves are applied to perform the DNP transfer since the triplet state providing the electron spin has a finite lifetime, typically less than a second. The method has only been shown to be applicable to a very restricted number of molecules such as anthracene and pentacene.

In method (b), precursor molecules are split (photolysis) during light irradiation and form radical species that can be stable at low temperature. The samples can thus be exposed to light prior to be placed in the DNP polarizer where microwaves are used for the DNP transfer. The main problems linked to this method are that, first, the split molecules tend to recombine even at low temperature in the frozen state, which means that it is difficult to obtain concentrations of radicals that are larger than 1 mM, and, second, the product of these recombinations, the byproducts, are rarely endogenous and often not biocompatible. In addition, the possibly poor solubility of these compounds might limit not only the concentrations of radicals but also the concentration of substrates that can be mixed in with the precursor molecules.

This significantly limits the practical applicability of both approaches.

SUMMARY OF THE INVENTION

The present invention proposes the production of radicals under light irradiation in frozen samples containing molecular moieties with alpha-diketone groups (1,2-dione structural unit, inclusive of e.g. carboxylic acid, amide, acyl halide and aldehyde terminal ends), such as pyruvic acid (PA) or molecular moieties with gamma-keto-enone structural units (2,5-diene-1,4-dione structural unit, again inclusive of e.g. carboxylic acid, amide, acyl halide and aldehyde terminal ends) such as maleic acid (MA), fumaric acid (FA), or mixtures and/or derivatives thereof.

The purpose of the proposed method is to prepare frozen samples wherein the nuclear spin polarization can be enhanced via low-temperature dynamic nuclear polarization (DNP). The samples can then be analyzed via solid-state nuclear magnetic resonance or warmed up for use in liquid-state nuclear magnetic resonance or magnetic resonance imaging applications in the field of chemistry, biochemistry, biomedicine and medicine.

So compared with the two above mentioned approaches, a different method is proposed based on the photo-excited reactive state of molecular moieties with alpha-diketone groups. The molecules are not split (no photolysis) but rather photo-excited to induce electron transfer yielding radicals that are stable at low temperature. However, the excitation may also induce some photolysis to a certain extent, but only as a side effect, and the formed decomposition products are normally not the radicals. The samples can thus be prepared from seconds to months before the low-temperature DNP experiments. Unexpectedly, a concentration larger than 1 mM of stable radicals can be produced in frozen samples with molecular moieties with alpha-diketone groups or gamma-keto-enone groups such as MA, FA, PA or the like via light irradiation.

For applications in biology, biomedicine and medicine, endogenous biomolecules that can be photo-excited into a reactive state to create radicals that are only stable at low temperature are preferred. The endogenous molecules are not split during light irradiation but rather lose or gain an electron via photo-induced electron transfer. Radical-free samples are obtained after warming up the sample above a critical temperature that depends on the molecules themselves and will contain only a small amount of byproducts resulting from radical scavenging. For instance, after irradiation of pure PA, the only byproduct is acetic acid in a concentration that is between 100-1000 times smaller than the pyruvic acid concentration.

One advantage of the proposed method compared to previous methods proposed before is that the paramagnetic centers will be automatically eliminated upon warming up and will provide radical-free biocompatible solutions that can be used for biological and biomedical in vitro or in vivo studies. Another advantage is that it is possible to force the scavenging of the radicals in the solid state, at a temperature at which the spin-lattice relaxation time is still very long, which means that a highly polarized solid-state radical-free sample can be prepared.

For solid-state DNP-NMR applications, the issue faced in the preparation of biologically relevant samples is the incorporation of radicals into the solid samples, whether it is onto proteins, inside cells or membranes or any other biological tissues. By targeting or adding an alpha-diketone group or a gamma-keto-enone group inside the sample, either through a reversible or irreversible chemical cross linking involving a reactive amino-acid having a nucleophilic (SH, OH, NH$_2$, . . . ), aromatic (phenyl, phenol, . . . ) electrophilic (carboxylic, . . . ) side chain, a reaction of sulfur, . . . , and further irradiate the samples with light, it is possible to introduce in a very controlled manner the radicals inside the sample.

The main aspect of the present invention is that it provides a method for enhancing nuclear polarization via DNP of samples containing alpha-diketone groups (1,2-dione structural unit, inclusive of e.g. carboxylic acid, amide, acyl halide and aldehyde terminal ends), such as pyruvic acid (PA) or molecular moieties with gamma-keto-enone structural units (2,5-diene-1,4-dione structural unit, again inclusive of e.g. carboxylic acid, amide, acyl halide and aldehyde terminal ends) such as maleic acid (MA), fumaric acid (FA), or mixtures and/or derivatives thereof.

So generally speaking the alpha-diketone functional groups, are molecules of the formula

(1)

wherein $R_1$ and/or $R_2$ are a non-reactive group, for instance selected from the group consisting of: halogen, —OH, —O—R, $CH_2$—R, $CH_3$, where R is selected from the group consisting of: H, alkyl, aryl or halogen (e.g. I, Br, Cl). In addition or in the alternative $R_1$ and/or $R_2$ can be a reactive functional group that allows a linking to biomolecules and/or a crosslinking of biomolecules of interest. The target biomolecules can be peptides, proteins, lipids (including phospholipids, membranes), sugars or other endogenous or exogenous metabolites.

Also generally speaking the gamma-diketone functional groups, are molecules of the formula (the hydrogen atoms attached to the two alkene carbon atoms are not illustrated):

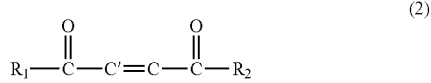

(2)

wherein $R_1$ and/or $R_2$ are a non-reactive group, for instance selected from the group consisting of: halogen, —OH, —O—R, $CH_2$—R, $CH_3$ where R is selected from the group consisting of: H, alkyl, aryl or halogen (e.g. I, Br, Cl). In addition or in the alternative $R_1$ and/or $R_2$ can be a reactive functional group that allows a linking to biomolecules and/or a crosslinking of biomolecules of interest. The target biomolecules can be peptides, proteins, lipids (including phospholipids, membranes), sugars or other endogenous or exogenous metabolites.

An example of a possible unsaturated cyclic 1,4-dione is given by a cholesterol derivative:

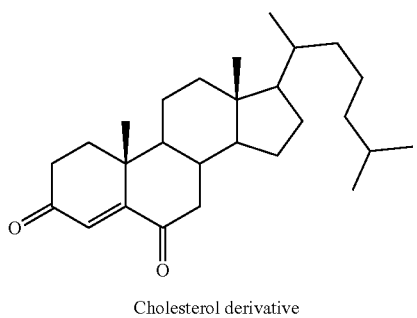 [SMILES: CC(C)CCCC(C)C1CCC2C3CC(=O)C4=CC(=O)CC[C@]4(C)C3CC[C@]12C]

Cholesterol derivative

A further example of substituted cyclic 1,4-dione is given by the coenzyme Q10:

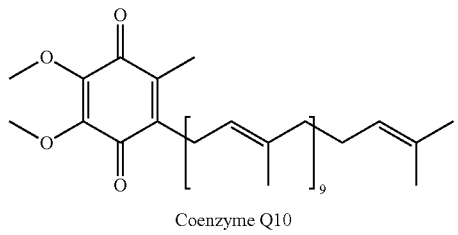

Coenzyme Q10

These classes of compounds could be natural or could be generated from precursors, either in situ during, in situ before the process or ex situ before the process. As an example, pyruvic acid can also be obtained from lactic acid by oxidation:

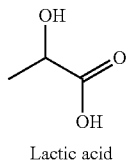

Lactic acid

Hyperpolarized substrates prepared via dissolution DNP have been proposed as MRI contrast agents for cancer or cardiac failure diagnosis and therapy monitoring through the detection of metabolic impairments in vivo. To enhance the polarization of substrates and reach an increase in MRI signal-to-noise ratio (SNR) of several orders of magnitude, the use of stable free radicals as polarizing agents was hitherto required. Their presence in the final aqueous solution containing the hyperpolarized substrates is problematic because they shorten the life time of the enhanced nuclear polarization and because of their toxicity. A filtering procedure is thus mandatory for clinical applications, but this process as well as the associated pharmacological tests necessary to prevent contamination increases the delay between preparation and injection of the contrast agents, leading to losses in SNR. With the proposed method, by shining UV light for less than an hour on a frozen pure e.g. endogenous substance, such as PA, it is possible to create enough radicals at low temperature for performing DNP. These radicals recombine during the fast dissolution process to give acetic acid, which is the only byproduct present in the hyperpolarized pyruvic acid aqueous solution. An in vivo metabolic hyperpolarized MRI study performed without any trace of paramagnetic species such as stable free radicals is presented to show the applicability and feasibility of the proposed method. The proposed new method opens the way to safe and straightforward clinical applications of hyperpolarized MRI and to other applications e.g. in NMR, MRS, and MRI.

Although most biomolecules can be hyperpolarized, one of the most promising compounds for clinical applications of hyperpolarized MR is PA thanks to its rather exceptional physicochemical properties: it forms a glass upon freezing and two of its three carbons have a molecular environment leading to particularly long $^{13}C$ relaxation times, on the order of 1 min. This is coupled with its central position in the glycolytic pathway: it connects glucose to lactate, alanine and acetyl-CoA. In animal models hyperpolarized PA is a powerful marker for cancer metabolism in particular because increased lactate levels consequence of the Warburg effect can be readily detected. Possible further applications are in the field of detection and/or monitoring of prostate cancer. Another quite remarkable property of PA that has not yet been exploited for DNP applications is the fact that it can generate radicals via photo-excitation into a reactive triplet state. This photo-induced electron transfer is observed in low concentrated (in the range of 0.01-1.0 M, typically ~0.1M) frozen aqueous PA solutions, but the kinetics of radical production and the maximum radical concentration, in particular the fact that a very large radical concentration can be produced in pure PA, have never been reported before.

Using a UV LED source as will be detailed further below, it is possible to produce up to 20 mM of radicals in pure PA at 77K in less than an hour (see FIG. 4). The ESR spectrum observed in natural abundance PA following the UV irradiation (see FIG. 5A) can be easily interpreted by taking into account the hyperfine coupling to the protons of the methyl group. An additional splitting is observed when natural abundance PA is replaced by [1-$^{13}$C]PA (See FIG. 5B). The presence of this splitting, which essentially corresponds to an isotropic hyperfine coupling to $^{13}C$ of about 1.3 mT, demonstrates that the $CO_2$ moiety is still attached to the radical species. Without being bound to any theoretical explanation, the unpaired electron spin giving rise to the ESR signal appears to be located on the orbital of a PA molecule from which one electron has extracted since the electron spin is coupled to both the carboxyl in C1 position and the methyl proton on the C3 position.

Generally speaking therefore the present invention is a method to prepare samples for solid-state DNP-NMR, liquid-state NMR, MRS using a photo-induced electron transfer at low temperature in samples e.g. containing maleic acid, fumaric acid or molecules with one or more alphadiketone functional groups to create radicals. These radicals will be scavenged while warming the samples up and the liquid-state samples will be free of radicals and only contain a small concentration of byproducts that can be chosen to be biocompatible for biological and in particular medical applications.

Generally speaking, the proposed invention relates to a method for the preparation of a sample comprising highly polarized nuclear spins, comprising at least the following steps:

a) provision of molecules with 1,2-dione structural units and/or molecules with 2,5-diene-1,4-dione structural units in the solid state;

b) generation of radicals from these molecules by photo induced electron transfer by a first electromagnetic irradiation in the visible or ultraviolet frequency range in the solid state;

c) dynamic nuclear polarization in the presence of a magnetic field in the solid state by applying a second electromagnetic irradiation with a frequency adapted to transfer spin-polarisation from the electrons to the nuclear spins leading to a highly polarized state thereof.

According to a first preferred embodiment of the proposed method the second electromagnetic irradiation is applied with a frequency essentially equal to the difference or the sum of the Larmor frequencies of the electron spins and the nuclear spins, respectively, in the presence of the applied magnetic field.

Preferably, the applied magnetic field in step c) is a static, preferably essentially homogeneous magnetic field with a strength of at least 3 T, preferably at least 4 T, and wherein further preferably the temperature during the first and/or second electromagnetic irradiation is in the range of less than 120K, preferably in the range of less than 80K, most preferably in the range of less than 5K.

According to yet another preferred embodiment, the first and second electromagnetic irradiation in steps b) and c) are applied sequentially.

Further preferably, the first irradiation takes place in the absence of a magnetic field for at least 10 minutes, preferably at least 30 minutes, most preferably in the range of 40-300 minutes.

Preferentially, the frequency of the first irradiation is in the wavelength range between 200 and 800 nm, applied in continuous wave or pulsed, coherent or incoherent mode.

For the first irradiation one, two or more light sources can be used in pulsed mode operation forming trains of light pulses of different photon energies, and/or pulse intensities, and/or pulse lengths that either overlap or are separated in time in order to optically pump the electronic transitions to reach the reactive molecular state.

The molecules with 1,2-dione structural units are preferably selected from the molecules according to formula (1) as detailed above, and/or the molecules with 2,5-diene-1,4-dione structural unit are selected from the molecules according to formula (2) as detailed above, wherein in both cases, independently, $R_1$ and/or $R_2$ are selected to be a non-reactive group, preferably selected from the group consisting of: —OH, —O—R, $CH_2$—R, $CH_3$, wherein R is selected from the group consisting of: H, alkyl, aryl or halogen (e.g. I, Br, Cl), and/or in both cases, independently, $R_1$ and/or $R_2$ are selected to be a reactive functional group allowing for a linking to biomolecules and/or a crosslinking of biomolecules of interest.

Further preferably, the molecules are isotopically enriched, preferably by at least one nuclear spin selected from the group consisting of: 2H, 6Li, 13C, 15N, 17O, wherein preferably the molecules are partly or completely carbon 13 enriched.

The molecules can be selected from the group consisting of: diacetyl, 2,3-pentanedione, 2,3-hexanedione, 2,3-heptanedione, pyruvic acid, oxaloacetatic acid, alpha-keto iso-caproate, alpha-ketoisovaleric acid, 3-mercaptopyruvic acid, 2-oxoglutaric acid, 2-ketobutyric acid, 2-ketohexanoic acid, 2-oxo-4-methylthiobutanoic acid, 2-ketopalmitic acid, dehydroascorbic acid, fumaric acid, maleic acid, as well as derivatives thereof and/or mixtures thereof, wherein preferably the molecule is selected to be pyruvic acid. Also possible are larger molecules, in particular biomolecules, to which one or several of these structural units are attached, either directly or via a spacer.

The molecules or the mixture thereof can be forming the sample for step a) entirely.

The molecules can also be provided as a solvent for further molecules, which further molecules are preferably isotopically enriched in 2H, 6Li, 13C, 15N, 17O, as a solvent, and then cooled to the solid state for steps b) and c).

The molecules can also be provided in another solvent, preferably selected from the group consisting of: water, ethanol, glycerol, 1,2-propanediol, glycol, DMSO, Xenon or a mixture thereof, and then cooled to the solid state for steps b) and c).

Subsequent to step c) the sample can be warmed up until reaching liquid state, preferably to a temperature above 77K, further preferably to a temperature above 273 K, and used for liquid and/or solid nuclear magnetic resonance (NMR), magnetic resonance spectroscopy (MRS) or magnetic resonance imaging (MRI), preferably in vitro or in vivo.

According to yet another preferred embodiment, the molecules are peptides, proteins, or RNA or DNA comprising the structural units or with at least one structural unit attached either directly or via a spacer.

The sample can within step b) be photo-excited with the light outside a DNP polarizer or a cryo-DNP magic angle spinning (MAS) probe prior to be transferred inside a DNP polarizer or a Cryo-DNP MAS probe for step c) that will be inserted inside an NMR magnet, or the sample can be photo-excited with the light inside a DNP polarizer, or the sample can be photo-excited with light inside a Cryo-DNP MAS probe inserted inside an NMR magnet.

The sample can further be exposed to acoustic waves or an electrical field prior to be warmed up after step c) in order to force the scavenging of the radicals, wherein preferably the acoustic waves are produced by piezoelectric transducers located inside a DNP polarizer.

After step c) the sample can be warmed up with a cold gas or a cold liquid to bring the temperature of the frozen solution between 77K and 273K in order to force the scavenging of the radicals while keeping the solution frozen, wherein preferably the cold liquid is an alcohol.

The samples can be extracted as a solid and melted outside the polarizer, preferably inside a magnetic field.

The sample can also be dissolved outside a DNP polarizer in a solvent thermalized at a temperature above the melting temperature of the sample or the sample can be dissolved inside the DNP polarizer in a solvent thermalized at a temperature above the melting temperature of the samples.

According to a preferred embodiment of the invention, a frozen sample containing maleic acid, fumaric acid or molecules with one or more diketone functional groups is exposed to electromagnetic radiation. The photon energy is to be properly set to match an electronic transition that will excite the reactive excited state of the molecules. The typical range of the electromagnetic spectrum is in the UV and VIS. The electromagnetic radiation is either natural (e.g. sun, chemical luminescence) or artificially produced by an either coherent or incoherent light source in form of e.g. gas discharge lamps, arc lamps, fluorescent or phosphorescent lamps, light emitting diodes (LEDs, including OLEDs), lasers (including higher harmonic generation), synchrotron radiation, black body radiation (including incandescent light bulbs). The light is brought to the sample either continuously (CW mode) or in form of pulses (pulsed mode).

Preferred are the following molecules containing alpha-diketone functional groups:

(1) Diacetyl, 2,3-pentanedione, 2,3-hexanedione, 2,3-heptanedione and all other molecules with the chemical group according to the formula:

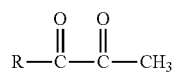

(3)

wherein R can be any reactive or non-reactive chemical functional group.

(2) Alpha-keto acids, in particular pyruvic acid, oxaloacetatic acid, alpha-keto isocaproate, alpha-ketoisovaleric acid, 3-mercaptopyruvic acid, 2-oxoglutaric acid (or alpha-ketoglutaric acid), 2-ketobutyric acid (or alpha-ketobutyric acid), 2-ketohexanoic acid, 2-Oxo-4-methylthiobutanoic acid, 2-ketopalmitic acid, as well as their salts. Generally speaking molecules with the chemical group according to the formula:

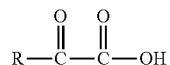

(4)

wherein R can be any reactive or non-reactive chemical functional group.

An example of substituted aliphatic 1,2-dione is pyruvic acid:

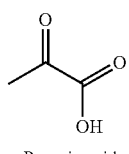

Pyruvic acid (3) Dehydroascorbic acid

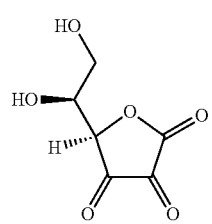

(5)

These molecules can be isotopically enriched (for instance with $^{13}C$) or not.

Also possible are dopa and dopamine related homologous compounds with the alpha-diketone moiety such as more specifically:

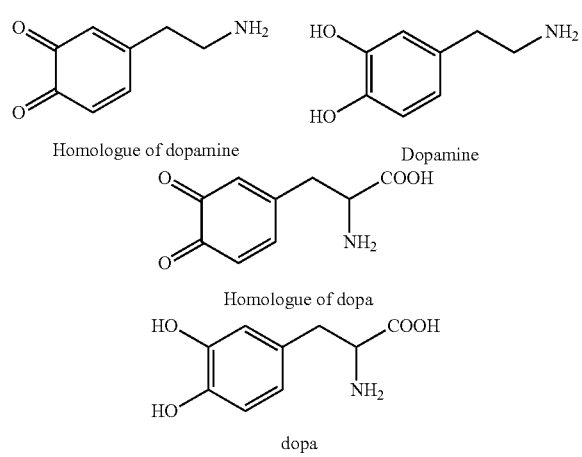

Homologue of dopamine

Dopamine

Homologue of dopa dopa

A further example of a possible substituted cyclic 1,2-dione is given by adrenochrome:

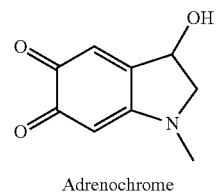

Adrenochrome

The preferred type of samples can be either pure (i.e. consisting of only maleic acid, fumaric acid or molecules containing alpha-diketone functional groups, in particular PA) or it can be maleic acid, fumaric acid and/or molecules containing alpha-diketone functional groups dissolved in any other substance of interest (f.i. lactic acid) that does not contain any alpha-diketone functional group or in one or more solvents, typically water, ethanol, glycerol, 1,2, propanediol, glycol, DMSO, xenon.

In a preferred embodiment of the present invention, the radicals are produced ex situ, outside of the polarizer, in a glass container filled with liquid nitrogen and in which the samples are placed before performing the light irradiation with one or more LEDs or one or more laser light sources. After about 1 h irradiation, the sample can be transferred into the DNP polarizer.

Furthermore the present invention relates to nuclear magnetic resonance (NMR), magnetic resonance spectroscopy (MRS) or magnetic resonance imaging (MRI) experiment, preferably in vitro or in vivo, using a hyperpolarized sample prepared using a method according to any of the preceding claims, preferably for enhancing the signal-to-noise ratio.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Figure 1:
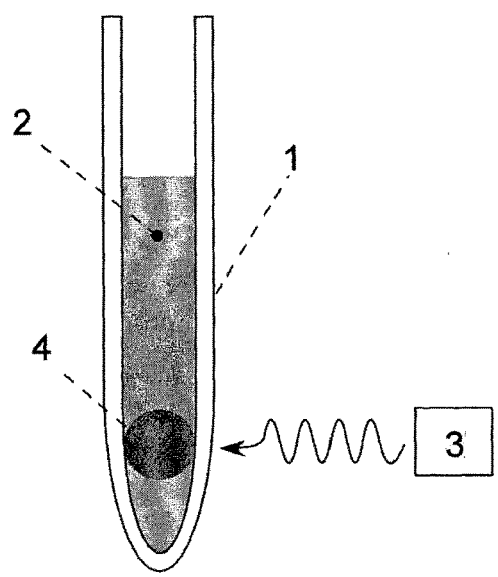
FIG. 1 shows a schematic cross-sectional view of an embodiment of the ex situ setup to create radicals in the frozen samples containing maleic acid, fumaric acid or molecules with alpha-diketone functional groups via the creation of photo-excited reactive states.

An example of an experimental set-up is schematically shown in FIG. 1. The radical concentration can be measured by ESR prior to inserting the sample inside the DNP polarizer (see FIGS. 4 and 5). In the FIG. 1, 1 designates a cryostat transparent to irradiating light, 2 liquid nitrogen, 3 a light source and 4 is a frozen sample containing polarizable molecules e.g. with maleic acid, fumaric acid or one or more alpha-diketone functional group.

Figure 2:
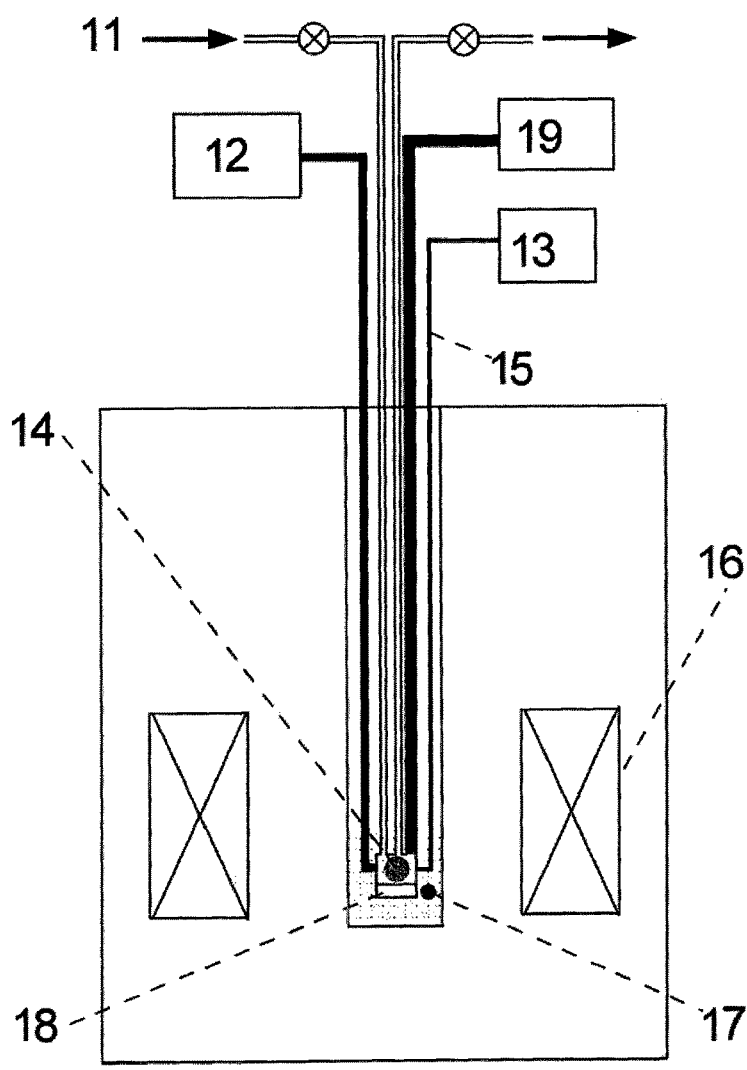
FIG. 2 shows schematically an embodiment of a setup to produce the radicals in situ by bringing the light inside a DNP polarizer through an optical fiber.

In a second example of an experimental set-up schematically shown in FIG. 2, the radicals are produced inside the polarizer by irradiation through an optical fiber. In this case 11 designates a warm or cold fluid to thermalize or dissolve the frozen sample in order to force the scavenging of the radicals prior to sample extraction, 12 a microwave source tuned to the frequency corresponding to the absorption of the electron and nuclear spins system in the frozen sample, 13 a light source, 14 a frozen sample containing polarizable molecules, 15 an optical fiber, 16a superconducting magnet, 17 a liquid helium or cold helium gas, 18 a piezoelectric actuator and 19 an acoustic wave source.

The set-ups can generally be adapted to improve the radical production via electro-assisted electron capture by placing electrodes across the sample and produce an electric field during light irradiation.

The set-ups can also be adapted to force the scavenging of the radical in the solid state by applying acoustic waves produced by piezoelectric transducers or other sources outside the polarizer and brought to the samples inside the polarizer through a waveguide (see FIG. 2). The radicals can also be scavenged via electro-oxidation or electro-reduction (pulsed or continuous).

Another way to scavenge the radicals in the solid state is to exposing the frozen samples to a cold gas or a cold liquid, such as an alcohol, in order to bring the temperature of the frozen samples between 77K and 273K and force the scavenging of the radicals while keeping the samples in a solid state. The sample can then be extracted as a solid to be melted outside the DNP polarizer in an external magnet.

Figure 3:
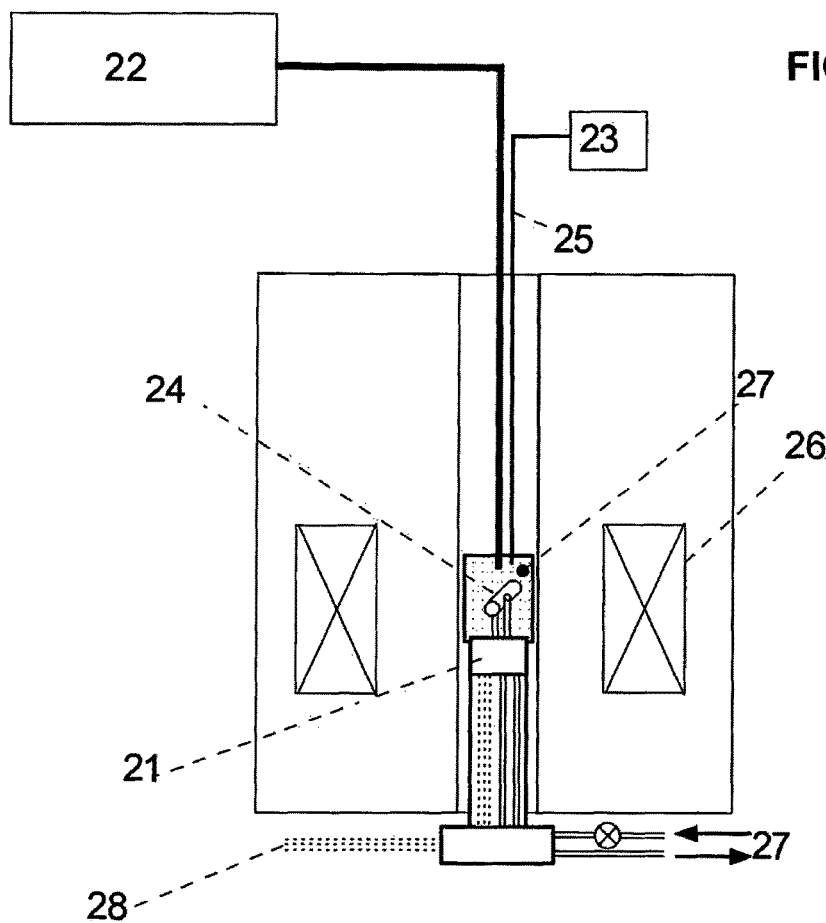
FIG. 3 shows schematically an embodiment of a setup to produce the radicals in situ by bringing the light inside a NMR magnet with a cryo-MAS probe. (1) Cryo-MAS NMR probe.

In a third example of an experimental set-up schematically shown in FIG. 3, the radicals are produced in frozen samples, f.i. cells or cell membranes containing proteins tagged with one or more alpha-diketone groups, placed inside the rotor of a cryo-MAS probe coupled to an optical fiber that can photo-excite the alpha-diketone groups prior to performing solid-state DNP-NMR experiments. In this case, 21 designates a cryo-MAS NMR probe, 22 a microwave source tuned to the frequency corresponding to the absorption of the electron and nuclear spins system in the frozen sample; 23 a light source, 24 a frozen sample containing polarizable molecules; 25 an optical fiber, 26 a superconducting magnet, 27 cold nitrogen or helium gas and 28 rf cables.

Figure 4:
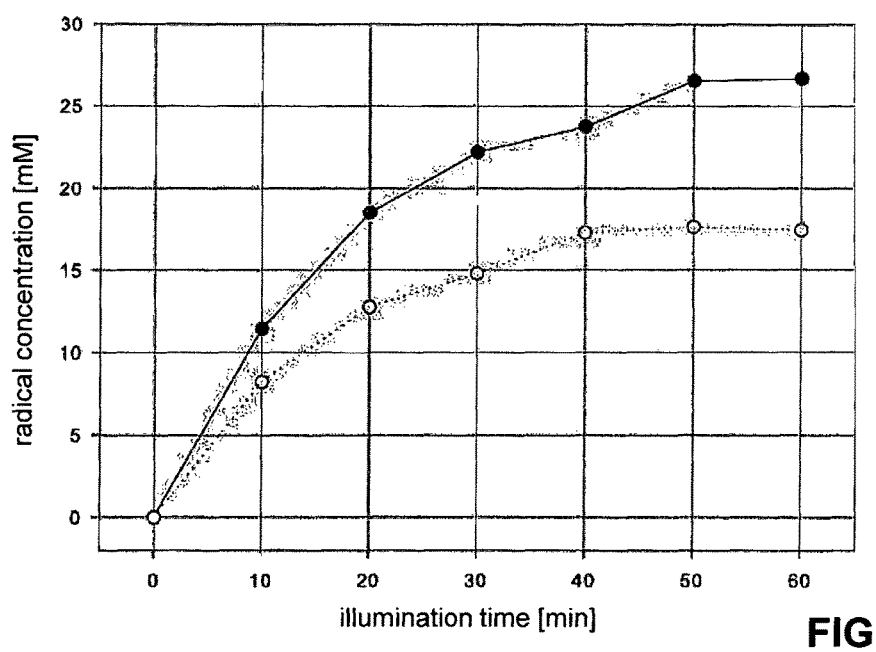
FIG. 4 shows the radical concentration in pure [1-$^{13}$C]PA and in a [1-$^{13}$C]PA:H$_2$O 1:1 (vol./vol.) solution as a function of UV irradiation time as measured by X-band ESR at 77K.
Figure 5A:
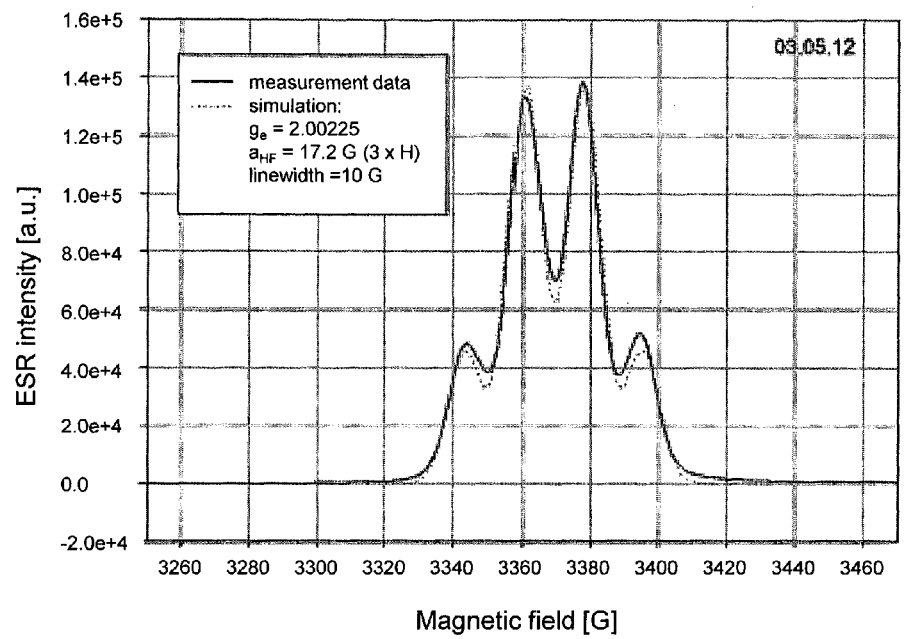
FIG. 5 shows the integral of the X-band ESR spectrum measured at 77K in UV-irradiated (a) natural abundance PA and (b) [1-$^{13}$C]PA.
Figure 5B:
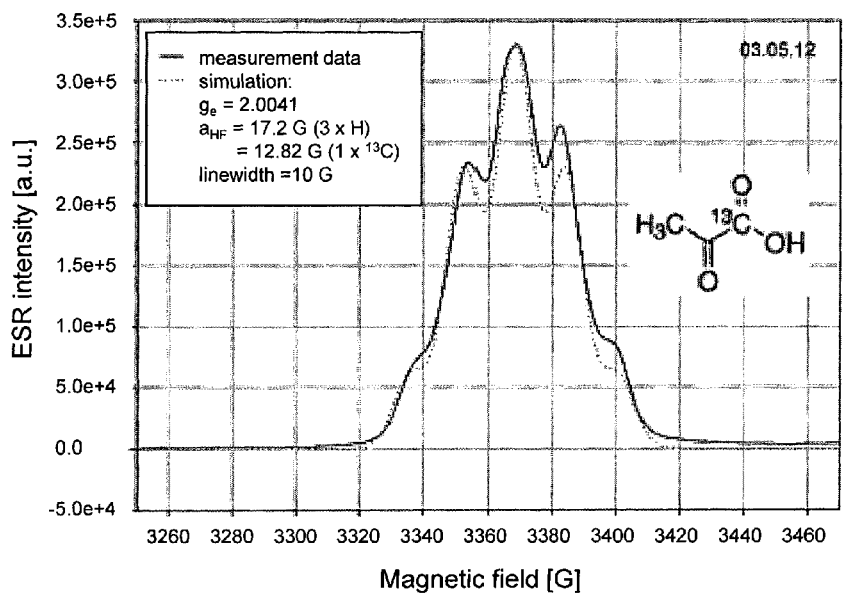

A preferred sample is frozen pure [1-$^{13}$C]pyruvic acid irradiated at 365 nm using the setup described in FIG. 1 (see FIGS. 4 and 5).

Figure 6:
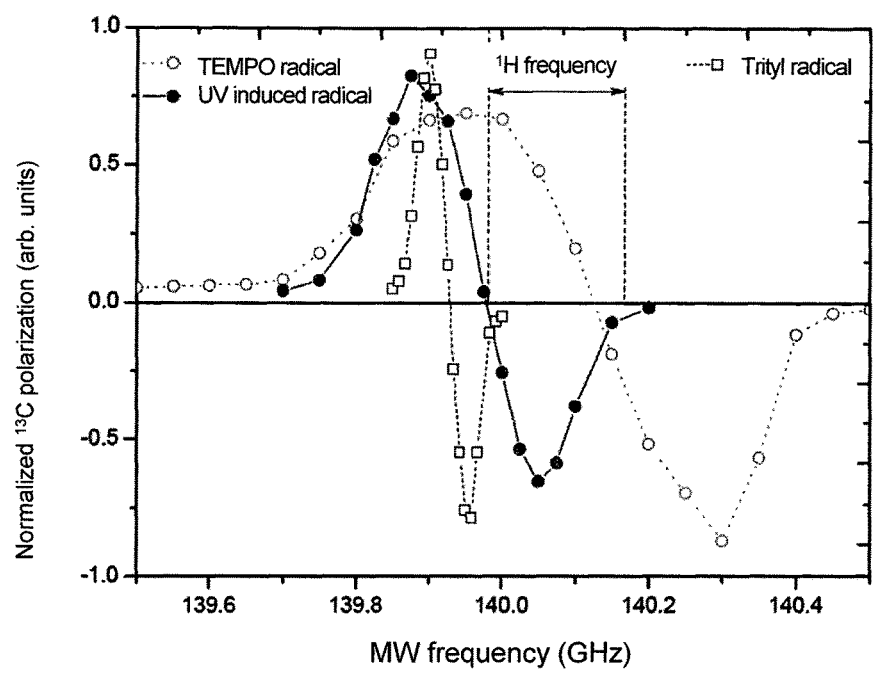
FIG. 6 shows a comparison of the $^{13}$C microwave spectrum measured in UV-irradiated [1-$^{13}$C]pyruvic acid, [1-$^{13}$C]pyruvic acid doped with 20 mM trityl radicals, and a 3M aqueous solution of [1-$^{13}$C]pyruvate doped with 50 mM TEMPO.

As a consequence of the rather narrow solid-state ESR line width (see FIG. 5), the microwave spectrum measured via $^{13}$C NMR at 1.2K by varying the ESR frequency is narrower than the one measured in samples doped with TEMPO nitroxyl radicals (see FIG. 6). Although the observed line width is substantially wider than the one obtained with trityl radicals (see FIG. 6), the so-called solid effect is expected to participate in the DNP process and the final $^{13}$C polarization is larger than the polarization that can be obtained with nitroxyl radicals for which the thermal mixing is largely dominant. A $^{13}$C polarization of 15% could be achieved in a sample containing 15 mM of radical within 1.5 h at 5 T and 1K using 30 mW microwave power.

Figure 7:
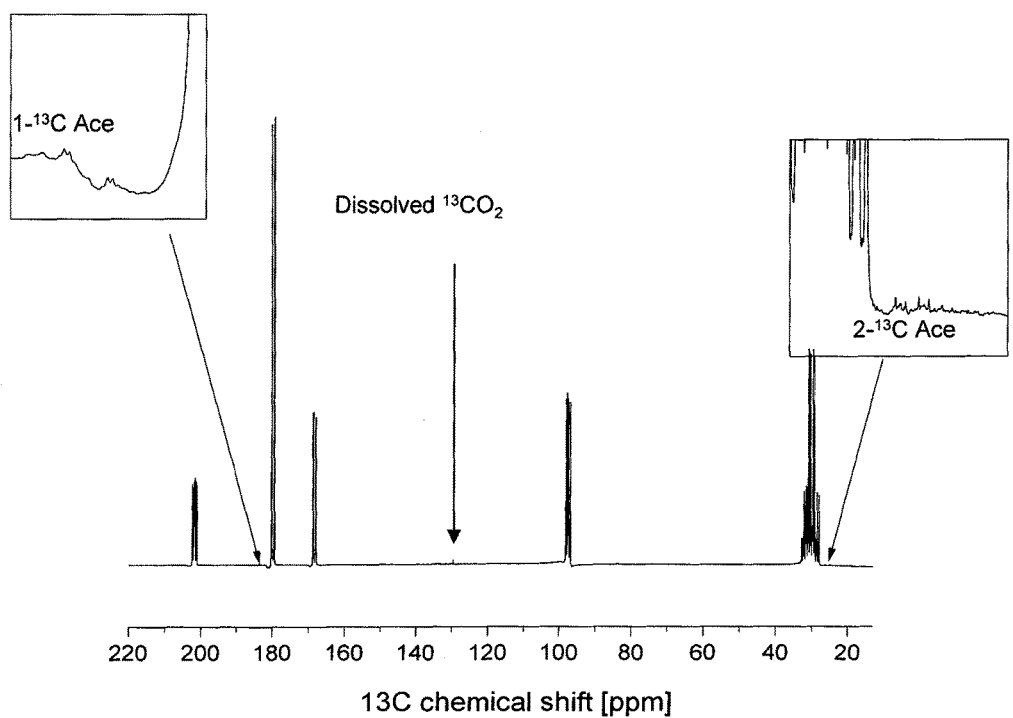
FIG. 7 shows a high-resolution NMR spectrum of UV-irradiated [1-$^{13}$C]pyruvic acid melted in D$_2$O (0.9M)

One compelling feature of the radicals created by UV illumination of frozen PA in the framework of hyperpolarized MR is that they recombine to biocompatible non-radical species within a fraction of second upon dissolution. One observes by $^{13}$C high-resolution room-temperature NMR measurements performed on UV irradiated frozen [U-$^{13}$C] PA dissolved in D$_2$O at 900 mM that the only products of recombination are CO$_2$ and the biomolecule acetic acid (see FIG. 7), a biomolecule present in human blood at a concentration 0.05-0.2 mM in healthy subjects. Upon dissolution, the carboxyl carbon of pyruvic acid is cleaved from the molecule to become carbon dioxide and the other two carbons react with H$_2$O to become acetic acid (see FIG. 7). The concentration of acetic acid in the hyperpolarized PA solution is about 1000 times lower than the amount of PA, which means that a 50 mM pyruvate solution will contain around 0.05 mM of acetate and would thus not lead to an increase in acetate blood concentration by more than 10%. In addition, with the most widely used substrate [1-$^{13}$C]PA, the resulting acetate molecule is unlabeled and its contribution to the $^{13}$C signal will thus be negligible at such low concentrations. In fact, the label ends up in $^{13}$CO$_2$ gas, which is expelled from the solution during the extraction of the dissolved frozen sample from the hyperpolarizer with helium gas (one measures $^{13}$CO2 in the experiment shown in FIG. 7 because the frozen sample is simply melted in D$_2$O and not degassed or flushed with helium gas). As a consequence, not only the solution is free of paramagnetic impurities as demonstrated by the observed relaxation time equivalent to the T$_1$ measured in a degassed pure aqueous PA solution, but also all potential toxicity issues are alleviated.

Figure 8:
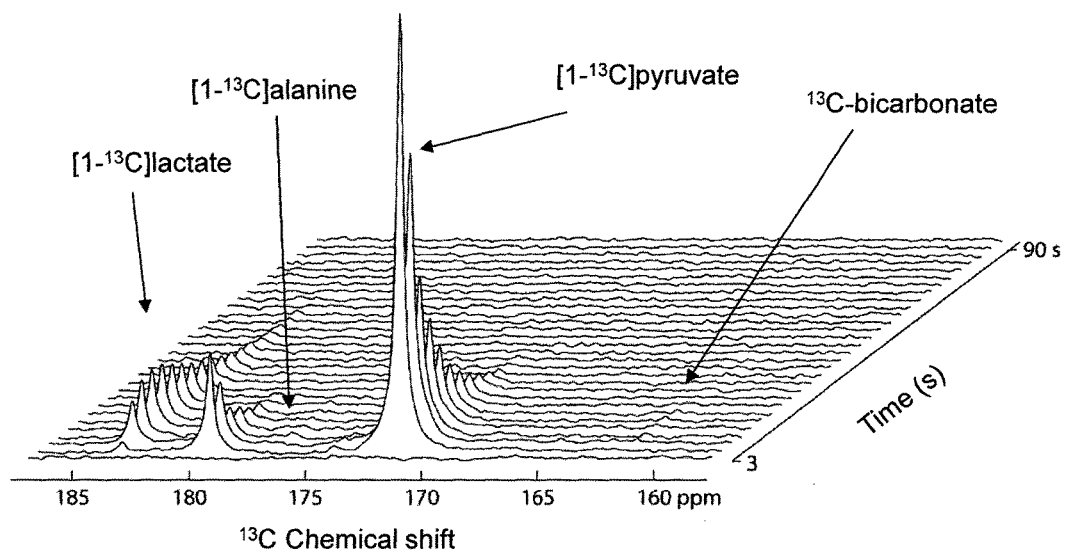
FIG. 8 shows in vivo $^{13}$C spectra recorded in a mouse brain following the injection of 300 uL of hyperpolarized [1-$^{13}$C]pyruvate solution prepared with UV-irradiated pure [1-$^{13}$C]pyruvic acid.

To demonstrate the potential of the method, contrast agents for in vivo MR are prepared, namely a 50 mM hyperpolarized pyruvate solution from a UV irradiated PA sample using the hardware described above, and 300 uL of the solution were injected in a mouse femoral vein prior to performing real-time metabolic measurements in the brain with a 3 s time resolution. The lactate, alanine and bicarbonate signals were recorded as a function of time in the mouse brain (see FIG. 8). This is the first in vivo hyperpolarized MR study of cerebral metabolism ever reported in mice.

So a MR contrast agent can be obtained via dissolution DNP from a frozen pure endogenous substance that is simply exposed to a commercially available LED UV light source for less than an hour. The solution containing the hyperpolarized $^{13}C$-labeled contrast agent is uncontaminated by paramagnetic impurities such as free stable radicals or any other non-endogenous substance and in vivo real-time metabolic measurements with a three second time resolution could be recorded in a 9.4 T MR imager following its injection thanks to the four-orders of magnitude $^{13}C$ SNR enhancement. So the novel method was applied to prepare hyperpolarized PA, the clinical potential of which has been already demonstrated in oncology and cardiology.

Experimental Part:

In summary, [1-$^{13}C$] PA was frozen in the form of 2 uL beads by plunging droplets in liquid nitrogen. The frozen beads were irradiated for 1 h with UV light using a LED source (Hammamatsu Photonics LC-L2) and consecutively placed inside a 5 T and 1±0.05 K custom-designed DNP polarizer. Following polarization, the PA samples were rapidly dissolved and transferred into an infusion pump placed inside the bore of a 9.4 T imager. The pump was programmed to automatically inject 300 uL of the hyperpolarized solution (pyruvate concentration ~50 mM) into a mouse femoral vein. In vivo $^{13}C$ spectra and images were acquired with a custom-designed surface coil placed on top of the mouse head using adiabatic RF pulses to compensate for B1 inhomogeneities. Localization was achieved using an outer volume suppression scheme. Anesthetized animal physiology was monitored (respiration rate ~100 min-1) and body temperature was kept between 37-38° C.

Experimental Details:

Dynamic Nuclear Polarization of [1-$^{13}C$]PA.

The carbon-13 nuclear spins in frozen[1-$^{13}C$]PA (Sigma-Aldrich) were dynamically polarized using a custom-designed DNP polarizer operating at 5 T and 1+0.05 K. Droplets of pure [1-$^{13}C$]PA were plunged in liquid nitrogen to form frozen beads of about 2 mm diameter. Ten frozen beads were placed inside the DNP polarizer sample holder, which was then inserted into the microwave cavity located within the cryostat filled with about 0.5 L of liquid helium at atmospheric pressure (4.2 K). The vacuum pump system was then turned on to lower the temperature of the sample space such as to maintain the frozen sample under superfluid helium at 1±0.05 K.

The microwave power at the output of the source was set to 30 mW and the irradiation frequency was set to 139.85 GHz. The nuclear polarization was monitored as a function of time by means of pulsed NMR using 5 degree tipping pulses. Once the polarization on the $^{13}C$ nuclei had reached a targeted value (the $^{13}C$ solid-state polarization reached 15±2% after 1.5±0.2 h in [1-$^{13}C$]PA samples, the frozen solution was dissolved in 5 ml of superheated $D_2O$ (170° C.) by means of a dissolution apparatus. In the system used for the present experiments, a helium gas stream drives the resulting solution out of the polarizer magnet through a 6 m long capillary into the bore of an animal imager, where the sample is collected in a remotely controlled infusion pump that separates the liquid solution from the gas, and infuses a chosen amount of liquid solution into an animal. The delay between dissolution and infusion was set to 3 s.

Animal Preparation.

In vivo experiments were performed on NMRI mice. All experiments were approved by the local ethics committee. Animals were anesthetized with 1.5% isoflurane in a 30% $O_2$/70% $N_2O$ mixture. A femoral vein was catheterized for PA infusion. The mouse was placed on a holder along with the infusion pump and the femoral vein catheter was connected to the outlet of the pump. The holder was then inserted inside the scanner. A bolus of about 0.3 ml of hyperpolarized solution containing approximately 50 mM of the $^{13}C$ labeled PA was infused within 5 s. Mouse physiology was monitored and kept stable during the experiments, body temperature was kept between 37-38° C., while respiration rate was maintained at around 100 $min^{-1}$ by adjustment of the isoflurane dose. The rate and dose of the infusion was determined in bench experiments to ensure that the bolus-like infusion is not lethal for mice. After the experiment animals were euthanized with an overdose of pentobarbital.

MRI and MRS experiments. All measurements were performed on a Varian INOVA spectrometer (Varian, Palo Alto, Calif., USA) interfaced to a 31 cm horizontal-bore actively-shielded 9.4 T magnet (Magnex Scientific, Abingdon, UK). RF transmission and reception was done using a home-built hybrid surface coil consisting of a proton quadrature coil and a three-loop 10 mm diameter carbon coil. This coil was placed on top of the mouse head. The $^{13}C$ spectra were acquired through single pulse experiments with adiabatic radiofrequency pulses. The acquisition time was set to 200 ms. To generate an external reference signal a small sphere filled with 99% $^{13}C$-labeled formic acid was placed in the center of the carbon coil. High order shimming was performed using the FASTESTMAP algorithm.

| LIST OF REFERENCE SIGNS | |
|---|---|
| 1 | cryostat transparent to irradiating light |
| 2 | liquid nitrogen |
| 3 | light source |
| 4 | frozen sample containing polarizable molecules |
| 11 | warm or cold fluid |
| 12 | microwave source |
| 13 | light source |
| 14 | frozen sample containing polarizable molecules |
| 15 | optical fiber |
| 16 | superconducting magnet |
| 17 | liquid helium or cold helium gas |
| 18 | piezoelectric actuator |
| 19 | acoustic wave source |
| 21 | cryo-MAS NMR probe |
| 22 | microwave source |
| 23 | light source |
| 24 | frozen sample containing polarizable molecules |
| 25 | optical fiber |
| 26 | superconducting magnet |
| 27 | cold nitrogen or helium gas |
| 28 | rf cables |

The invention claimed is:

1. A method for the preparation of a sample comprising highly polarized nuclear spins, comprising at least the following steps:
   a) provision of molecules in a solid state selected from the group consisting of: molecules with 1,2-dione structural units, molecules with 2,5-diene-1,4-dione structural units, and combinations thereof;

b) generation of radicals from these molecules in the solid state by photo induced electron transfer by a first electromagnetic irradiation in the visible or ultraviolet frequency range;

c) dynamic nuclear polarization in the presence of a magnetic field in the solid state by applying a second electromagnetic irradiation with a frequency adapted to transfer spin polarization from electrons to the nuclear spins leading to a highly polarized state thereof.

2. The method according to claim 1, wherein the first electromagnetic irradiation is applied with a frequency essentially equal to the difference or the sum of Larmor frequencies of the electron spins and the nuclear spins, respectively, in the presence of the applied magnetic field.

3. The method according to claim 1, wherein the first and second electromagnetic irradiation in steps b) and c) are applied sequentially.

4. The method according to claim 3, wherein for the first irradiation one, two or more light sources are used in pulsed mode operation forming trains of light pulses of different photon energies, different pulse intensities, different pulse lengths or combinations thereof, that either overlap or are separated in time in order to optically pump electronic transitions to reach a reactive molecular state.

5. The method according to claim 1, wherein the molecules with 1,2-dione structural units are selected from the molecules according to formula (1):

(1)

or wherein the molecules with 2,5-diene-1,4-dione structural unit are selected from the molecules according to formula (2)

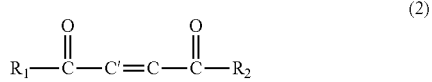
(2)

wherein in both cases, independently, $R_1$ and/or $R_2$ are selected to be a non-reactive group, and in both cases, independently, $R_1$ and/or $R_2$ are selected to be a reactive functional group allowing for a linking to biomolecules and/or a crosslinking of biomolecules of interest.

6. The method according to claim 5, wherein the molecules are isotopically enriched.

7. The method according to claim 1, wherein the molecules are selected from the group consisting of: diacetyl, 2,3-pentanedione, 2,3-hexanedione, 2,3-heptanedione, pyruvic acid, oxaloacetatic acid, alpha-keto isocaproate, alpha-ketoisovaleric acid, 3-mercaptopyruvic acid, 2-oxoglutaric acid, 2-ketobutyric acid, 2-ketohexanoic acid, 2-oxo-4-methylthiobutanoic acid, 2-ketopalmitic acid, dehydroascorbic acid, fumaric acid, maleic acid, adrenochrome, cholesterol derivatives with 2,5-diene-1,4-dione structural unit, Coenzyme Q10, dopamine homologues with 1,2 dione structural units, dopa homologues with 1,2 dione structural units, and derivatives thereof and mixtures thereof.

8. The method according to claim 1, wherein the molecules or a mixture thereof are forming the sample for step a) entirely,
or wherein the molecules are provided as a solvent for further molecules, and then cooled to the solid state for steps b) and c),
or wherein the molecules are provided in another solvent, and then cooled to the solid state for steps b) and c).

9. The method according to claim 1, wherein subsequent to step c) the sample is warmed up until reaching liquid state, and used for liquid or solid nuclear magnetic resonance (NMR) or both, magnetic resonance spectroscopy (MRS) or magnetic resonance imaging (MRI), including in vitro or in vivo.

10. The method according to claim 1, wherein the molecules are peptides, proteins, or RNA or DNA comprising the structural units or with at least one structural unit attached either directly or via a spacer.

11. The method according to claim 1, in which the sample is photo-excited with light outside within step b) in a DNP polarizer or a cryo-DNP magic angle spinning (MAS) probe prior to be transferred inside a DNP polarizer or a Cryo-DNP MAS probe for step c) that will be inserted inside an NMR magnet,
or in which the sample is photo-excited with the light inside a DNP polarizer
or in which the sample is photo-excited with light inside a Cryo-DNP MAS probe inserted inside an NMR magnet.

12. The method according to claim 1 in which the sample is exposed to acoustic waves or an electrical field prior to be warmed up after step c) in order to force a scavenging of the radicals.

13. The method according to claim 1, wherein after step c) the sample is warmed up with a cold gas or a cold liquid to bring a temperature of a frozen solution between 77K and 273K in order to force a scavenging of the radicals while keeping the solution frozen,
or wherein the samples are extracted as a solid and melted outside a polarizer.

14. The method according to claim 1, wherein the sample is dissolved outside a DNP polarizer in a solvent thermalized at a temperature above a melting temperature of the sample
or wherein the sample is dissolved inside the DNP polarizer in a solvent thermalized at a temperature above the melting temperature of the samples.

15. Nuclear magnetic resonance (NMR), magnetic resonance spectroscopy (MRS) or magnetic resonance imaging (MRI) experiment, including in vitro or in vivo, using a hyperpolarized sample prepared using a method according to claim 1, for enhancing a signal-to-noise ratio.

16. The method according to claim 1, wherein the first electromagnetic irradiation is applied with a frequency essentially equal to the difference or the sum of Larmor frequencies of electron spins and the nuclear spins, respectively, in the presence of the applied magnetic field, wherein the magnetic field is a static, essentially homogeneous magnetic field with a strength of at least 3 T.

17. The method according to claim 1, wherein the first electromagnetic irradiation is applied with a frequency essentially equal to the difference or the sum of Larmor frequencies of electron spins and the nuclear spins, respectively, in the presence of the applied magnetic field, and wherein a temperature during the first or second electromagnetic irradiation or both is in the range of less than 120K.

18. The method according to claim 1, wherein the first electromagnetic irradiation is applied with a frequency essentially equal to the difference or the sum of Larmor frequencies of electron spins and the nuclear spins, respectively, in the presence of the applied magnetic field, and wherein a temperature during the first or second electromagnetic irradiation or both, in the range of less than 5K.

19. The method according to claim 1, wherein the first and second electromagnetic irradiation in steps b) and c) are applied sequentially, and wherein the first irradiation takes place in the absence of a magnetic field for at least 10 minutes.

20. The method according to claim 1, wherein the first and second electromagnetic irradiation in steps b) and c) are applied sequentially, and wherein the first irradiation takes place in the absence of a magnetic field for in the range of 40-300 minutes.

21. The method according to claim 1, wherein the first and second electromagnetic irradiation in steps b) and c) are applied sequentially, and wherein the frequency of the first irradiation is in the wavelength range between 200 and 800 nm, applied in continuous wave or pulsed, coherent or incoherent mode.

22. The method according to claim 1, wherein the molecules with 1,2-dione structural units are selected from the molecules according to formula (1):

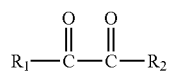
(1)

or wherein the molecules with 2,5-diene-1,4-dione structural unit are selected from the molecules according to formula (2)

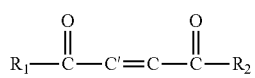
(2)

wherein in both cases, independently, $R_1$ and/or $R_2$ are selected to be a non-reactive group, selected from the group consisting of: halogen, —OH, —O—R, $CH_2$—R, $CH_3$, wherein R is selected from the group consisting of: H, alkyl, aryl or halogen, and in both cases, independently, $R_1$ and/or $R_2$ are selected to be a reactive functional group allowing for a linking to biomolecules or a crosslinking of biomolecules of interest.

23. The method according to claim 5, wherein the molecules are isotopically enriched, by at least one nuclear spin selected from the group consisting of: $^2H$, $^6Li$, $^{13}C$, $^{15}N$, $^{17}O$.

24. The method according to claim 5, wherein the molecules are partly or completely carbon 13 enriched.

25. The method according to claim 1, wherein the molecule is selected to be pyruvic acid.

26. The method according to claim 1, wherein the molecules or a mixture thereof are forming the sample for step a) entirely,
   or wherein the molecules are provided as a solvent for further molecules, which further molecules are isotopically enriched in $^2H$, $^6Li$, $^{13}C$, $^{15}N$, $^{17}O$, as a solvent, and then cooled to the solid state for steps b) and c),
   or wherein the molecules are provided in another solvent, selected from the group consisting of: water, ethanol, glycerol, 1, 2-propanediol, glycol, DMSO, Xenon or a mixture thereof, and then cooled to the solid state for steps b) and c).

27. The method according to claim 1, wherein subsequent to step c) the sample is warmed up until reaching liquid state, to a temperature above 273 K, and used for liquid or solid nuclear magnetic resonance (NMR) or both, magnetic resonance spectroscopy (MRS) or magnetic resonance imaging (MRI), including in vitro or in vivo.

28. The method according to claim 1 in which the sample is exposed to acoustic waves or an electrical field prior to be warmed up after step c) in order to force a scavenging of the radicals, wherein the acoustic waves are produced by piezoelectric transducers located inside a DNP polarizer.

29. The method according to claim 1, wherein after step c) the sample is warmed up with a cold gas or a cold liquid to bring a temperature of a frozen solution between 77K and 273K in order to force a scavenging of the radicals while keeping the solution frozen, wherein the cold liquid is an alcohol, or wherein the samples are extracted as a solid and melted outside a polarizer, inside a magnetic field.

* * * * *